United States Patent
Kwak et al.

(10) Patent No.: US 9,502,078 B2
(45) Date of Patent: Nov. 22, 2016

(54) STACK BANK TYPE SEMICONDUCTOR MEMORY APPARATUS CAPABLE OF IMPROVING ALIGNMENT MARGIN

(71) Applicant: SK hynix Inc., Icheon-si Gyeonggi-do (KR)

(72) Inventors: Seung Wook Kwak, Icheon-si (KR); Sang Hoon Shin, Icheon-si (KR); Keun Soo Song, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/831,088

(22) Filed: Aug. 20, 2015

(65) Prior Publication Data

US 2015/0357004 A1  Dec. 10, 2015

Related U.S. Application Data

(62) Division of application No. 12/169,595, filed on Jul. 8, 2008, now Pat. No. 9,123,395.

(30) Foreign Application Priority Data

Nov. 9, 2007 (KR) .................. 10-2007-0114146
Nov. 12, 2007 (KR) .................. 10-2007-0114944
Nov. 13, 2007 (KR) .................. 10-2007-0115462

(51) Int. Cl.
*G11C 5/02* (2006.01)
*G11C 8/10* (2006.01)
*G11C 7/10* (2006.01)
*G11C 5/06* (2006.01)

(52) U.S. Cl.
CPC ................. *G11C 5/025* (2013.01); *G11C 5/02* (2013.01); *G11C 5/063* (2013.01); *G11C 7/10* (2013.01); *G11C 8/10* (2013.01)

(58) Field of Classification Search
CPC ......... G11C 5/025; G11C 5/02; G11C 5/063; G11C 5/06; G11C 7/1069; G11C 7/12; G11C 8/08; G11C 8/10; G11C 8/12
See application file for complete search history.

(56) References Cited

U.S. PATENT DOCUMENTS

| 6,094,382 A * | 7/2000 | Choi ...................... G11C 29/80 365/200 |
| 6,731,527 B2 * | 5/2004 | Brown ................... G11C 5/025 365/228 |
| 9,123,395 B2 * | 9/2015 | Kwak .................... G11C 5/025 |
| 9,214,195 B1 * | 12/2015 | Kwak ..................... G11C 5/02 |

* cited by examiner

*Primary Examiner* — Andrew Q Tran
(74) *Attorney, Agent, or Firm* — William Park & Associates Ltd.

(57) ABSTRACT

A semiconductor memory apparatus is capable of improving the alignment margin for a bank and sufficiently ensuring a space for forming a global input/output line. The semiconductor memory apparatus includes a stack bank structure having at least two sub-banks continuously stacked without disconnection of data signal lines, and a control block arranged at one side of the stack bank structure to simultaneously control column-related signals of the sub-banks.

3 Claims, 11 Drawing Sheets

FIG.11 (PRIOR ART)
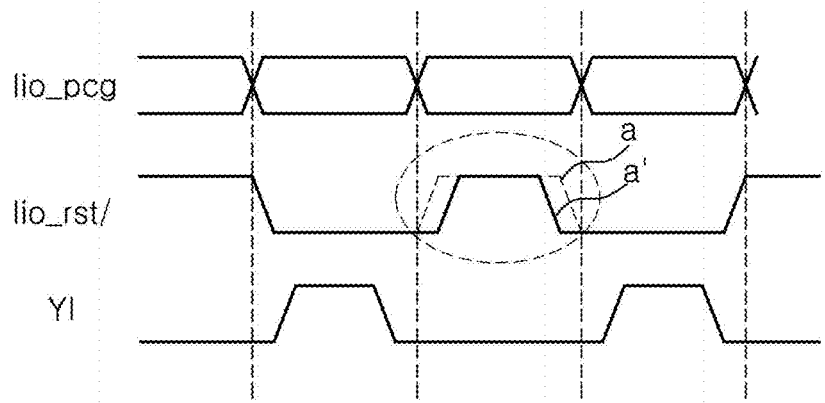
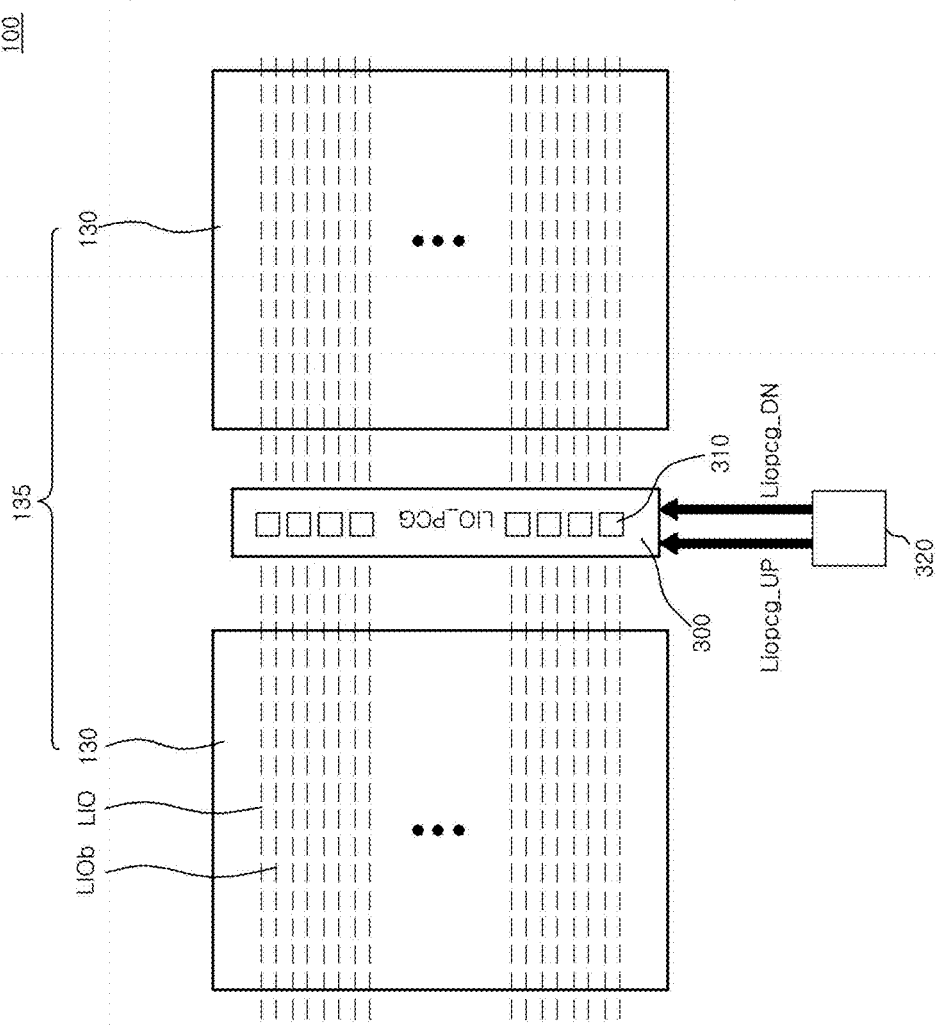
FIG.12

STACK BANK TYPE SEMICONDUCTOR MEMORY APPARATUS CAPABLE OF IMPROVING ALIGNMENT MARGIN

CROSS-REFERENCES TO RELATED APPLICATION

The present application claims priority under 35 U.S.C. 119(a) to Korean application numbers 10-2007-0114146 filed on Nov. 9, 2007, 10-2007-0114944 filed on Nov. 12, 2007 and 10-2007-0115462 filed on Nov. 13, 2007 in the Korean Intellectual Property office, each of which is incorporated by reference in its entirety as if set forth in full.

BACKGROUND

1. Technical Field

The embodiments described herein relate to a stack bank type semiconductor memory apparatus, and more particularly, to a semiconductor memory including a plurality of banks having a plurality of sub-banks.

2. Related Art

A conventional semiconductor memory apparatus includes a plurality of memory cells and a circuit for controlling the memory cells. At present, a bank concept has been introduced to control a plurality of memory cells by classifying the memory cells into groups. A bank represents an area that includes a plurality of memory cells. The memory cells are grouped into banks and controlled to improve the signal transmission characteristics of the semiconductor memory apparatus.

Recently, as the number of memory cells included in semiconductor memory apparatus has increased significantly, a multi-bank scheme has been proposed to control banks by dividing the banks into sub-banks.

FIG. 1 is a plan view illustrating a conventional semiconductor memory apparatus employing such a multi-bank scheme. Referring to FIG. 1, a semiconductor chip 10 may be divided into four banks 12a to 12d. The banks 12a to 12d are spaced apart from each other and a peripheral area 14 is interposed therebetween. For example, each of the banks 12a to 12d may be divided into an up bank UP and a down bank DOWN about a half line HL. Each up bank may be divided into four sub-banks 15 and each down bank may also be divided into the four sub-banks 15.

Each sub-bank 15 includes a plurality of word lines, a plurality of bit lines crossing the word lines, and a plurality of memory cells defined by the word and bit lines. The word and bit lines may extend in the y and x directions of FIG. 1.

At the present time, the semiconductor memory apparatus performs hierarchical data input/output. To this end, the semiconductor memory apparatus employs a plurality of data bus lines. A conventional semiconductor memory apparatus hierarchically transfers data, which is loaded on a bit line, to a sub-input/output (SIO, not shown) line, a local input/output (LIO, not shown) line, and a global input/output (GIO, not shown) line. The global input/output line is arranged between the sub-banks 15 perpendicular to the extension direction of the bit line.

Further, Y-control blocks 20 are arranged between the sub-banks 15 adjacent to the global input/output line to control a 'Yi' signal of a corresponding sub-bank 15, respectively. Furthermore, an X-hole 25, which includes circuits used for driving the word line, is arranged between the sub-banks 15 perpendicular to the Y-control block 20.

FIG. 2 is an enlarged plan view illustrating one bank in FIG. 1. AS can be seen, one fuse set 23 is installed in each sub-bank 15 to repair a memory cell defect occurring between the Y-control block 20 and the global input/output line. Further, circuits (not shown) are arranged in the peripheral area 14 to control the banks 12.

Each bank 12a of the semiconductor chip 10 receives commands and signals from the control circuits arranged in the peripheral area 14. However, the number of memory cells integrated in the banks 12 is increased due to the increase in the integration degree of conventional semiconductor memory apparatus. The increased number of memory cells increases the area of the sub-banks 15 and the area of the banks 12 including the sub-banks 15. In addition, the area of the blocks 20 and 25, which control the banks 12, must also increase.

Therefore, the alignment margin between the banks 12 is insufficient, and a sufficient gap between the sub-banks 15 may not be sufficiently ensured. The reduction in the gap between the sub-banks 15 may cause a reduction in the line width and spacing related to the global input/output line. The reduction in the spacing related to the global input/output line causes crosstalk, and the reduction in the line width of the global input/output line causes a signal delay.

SUMMARY

A semiconductor memory apparatus capable of improving the alignment margin for a bank is described herein. A semiconductor memory apparatus capable of sufficiently ensuring a space for forming a global input/output line is also described herein.

According to one aspect, a semiconductor memory apparatus includes a stack bank structure having at least two sub-banks continuously stacked, and a control block arranged at one side of the stack bank structure to simultaneously control column-related signals of the sub-banks. Wherein the data signal lines of the sub-banks for constructing the stack bank structure, which receive the same signal, are continuously connected each other.

According to another aspect, a semiconductor memory apparatus includes a plurality of banks divided based on a peripheral area, a plurality of stack bank structures arranged in the banks, being spaced apart from each other at a predetermined interval, wherein the stack bank structure includes a plurality of sub-banks, control blocks arranged at one side of the stack bank structure to control all column-related signals of the sub-banks constituting the stack bank structure, and a plurality of global input/output lines arranged between the stack bank structures.

According to still another aspect, a semiconductor memory apparatus includes a plurality of banks having a plurality of word lines, and a plurality of bit lines crossing the word lines, and a peripheral area dividing the banks and providing each bank with a control signal. One bank is divided into an up bank and a down bank, and each of the up bank and the down bank has a plurality of sub-banks arranged in a form of a matrix. Within the up and down banks, the sub-banks located at rows or columns parallel to an extension direction of the bit line are arranged while interposing a decoding block therebetween without disconnection of signal lines, thereby forming stack bank structures. Control blocks are provided at opposite sides of the stack bank structures to control bit line selection of all sub-banks constituting the stack bank structure, and a global input/output line is arranged between the control blocks to be used for data input/output of the sub-banks constituting the stack bank structure.

According to still another aspect, a semiconductor memory apparatus includes a plurality of stack bank structures having at least two sub-banks continuously arranged without disconnection of data signal lines, a plurality of global input/output lines arranged between the stack bank structures, a share block having a predecoder and a fuse set interposed between sub-banks in the stack bank structure, and a main decoder interposed between the sub-bank and the share block.

According to still another aspect, a semiconductor memory apparatus includes a pair of sub-banks constituting one bank and having a plurality of mat rows and a plurality of mat columns formed by a plurality of mats, a pair of data bus lines arranged in a space between the mat rows of the sub-bank and a plurality of precharge units arranged between the sub-banks and in a space between the mat columns to be electrically connected with the data bus lines of the sub-banks.

According to still another aspect, a semiconductor memory apparatus comprises a plurality of stack bank structures having at least two sub-banks continuously arranged without disconnection of data signal lines, a plurality of global input/output lines arranged between the stack bank structures, a share block having a predecoder and a fuse set interposed between sub-banks in the stack bank structure, a main decoder interposed between the sub-bank and the share block, and a precharge unit interposed between the predecoder and the fuse set in the share block.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 11 is a timing diagram illustrating a reset interval of a local input/output line in a conventional semiconductor memory apparatus;

FIG. 12 is a plan view illustrating a stack bank type semiconductor memory apparatus according to still another embodiment;

DETAILED DESCRIPTION

Figure 1:
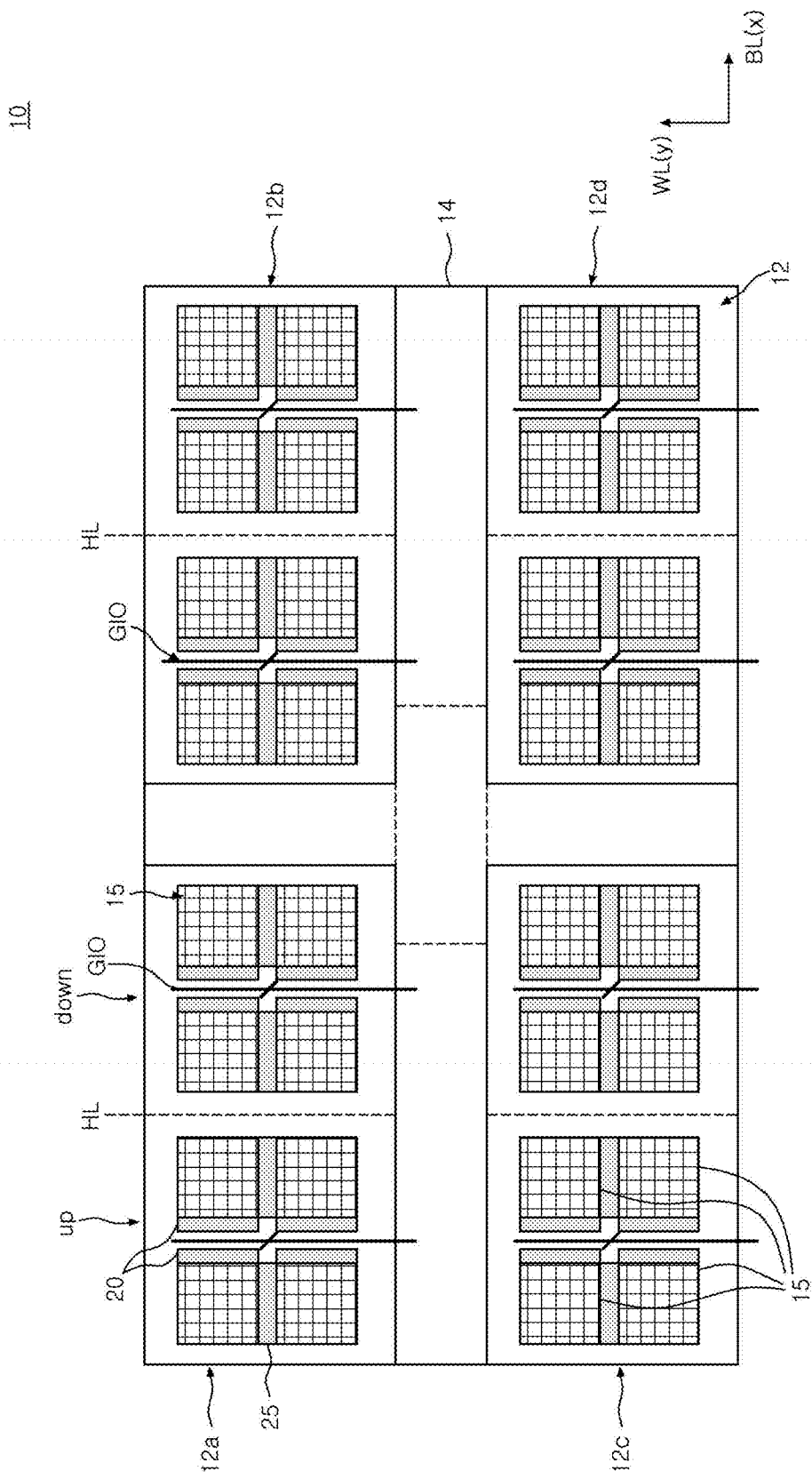
FIG. 1 is a plan view illustrating a conventional semiconductor memory apparatus employing a multi-bank scheme.
Figure 2:
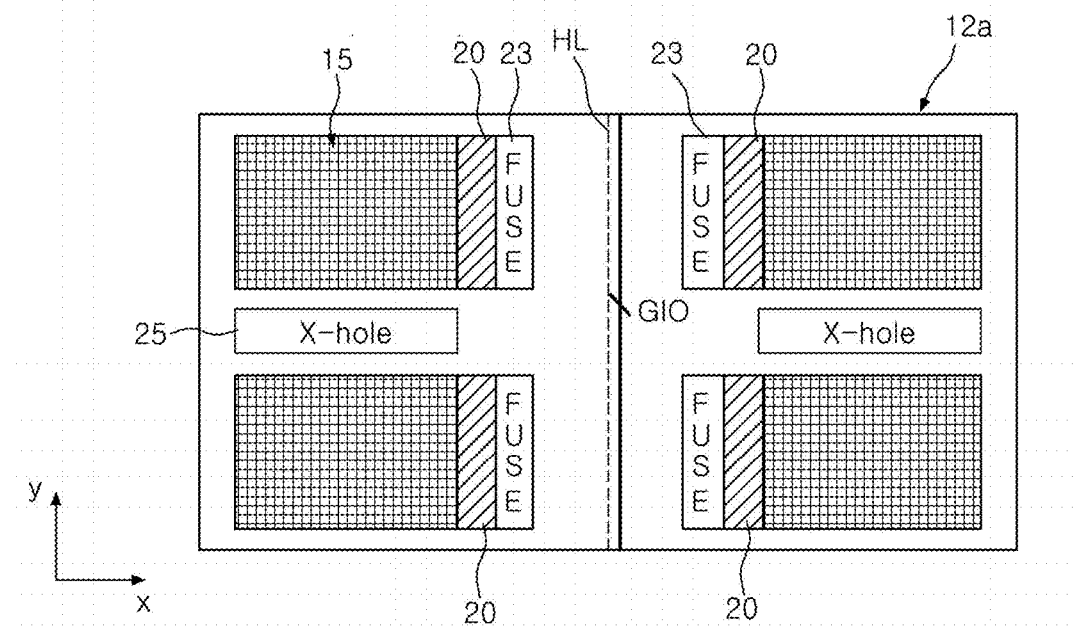
FIG. 2 is an enlarged plan view illustrating one bank of the semiconductor memory apparatus shown in FIG. 1.
Figure 3:
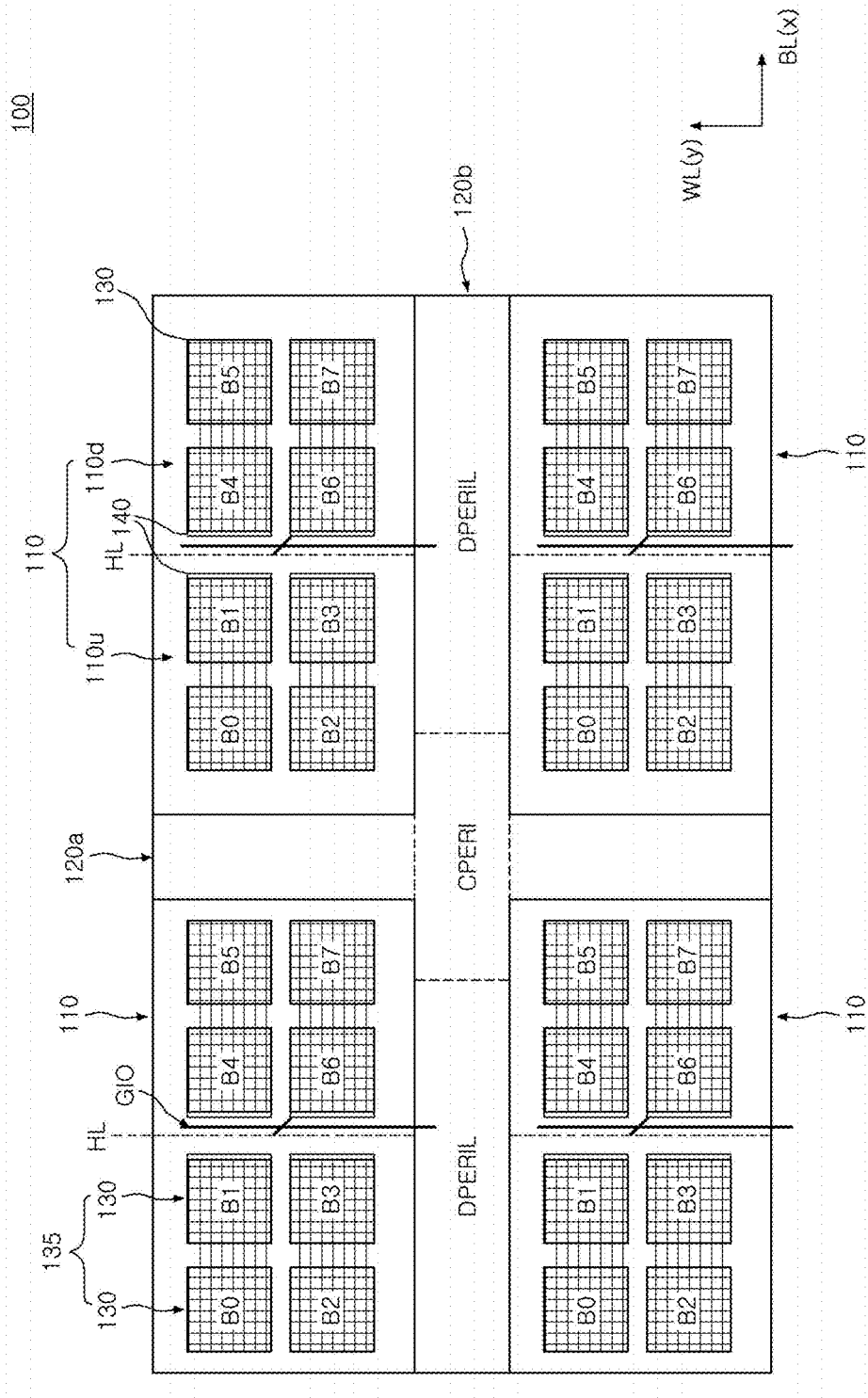
FIG. 3 is a plan view illustrating a stack bank type semiconductor memory apparatus according to one embodiment.

FIG. 3 is a diagram illustrating a semiconductor chip 100, e.g., a 512M DRAM, in accordance with one embodiment. Referring to FIG. 3, the semiconductor chip 100 can be divided into four banks 110. Each bank 110 can include a plurality of word lines, a plurality of bit lines crossing the word lines, and a plurality of memory cells defined by the word and bit lines. In this example, it is assumed that the word and bit lines WL and BL extend in the y and x directions of FIG. 3, respectively. A peripheral area can be made up of a first peripheral area 120a, which isolates the banks 110 in the x direction, and a second peripheral area 120b that isolates the banks 110 in the y direction.

Further, the second peripheral area 120b can be divided into a center area CPERI and a peripheral area DPERIL. The center area CPERI can be located at the center of the semiconductor chip 100 and can include circuits configured to receive commands for driving the DRAM. The peripheral area DPERIL can be located between the banks 110 to allow data pads (not shown) to be arranged therein.

Each bank 110 can be divided into half banks, i.e., an up bank 110u and a down bank 110d, about a virtual half line HL. The half line HL can be parallel to the word lines. Further, each of the up bank 110u and the down bank 110d can include four sub-banks 130 (B0-B3 and B4-B7), i.e. quarters. Thus, one bank 110 can include eight sub-banks 130 (B0-B7).

Figure 4:
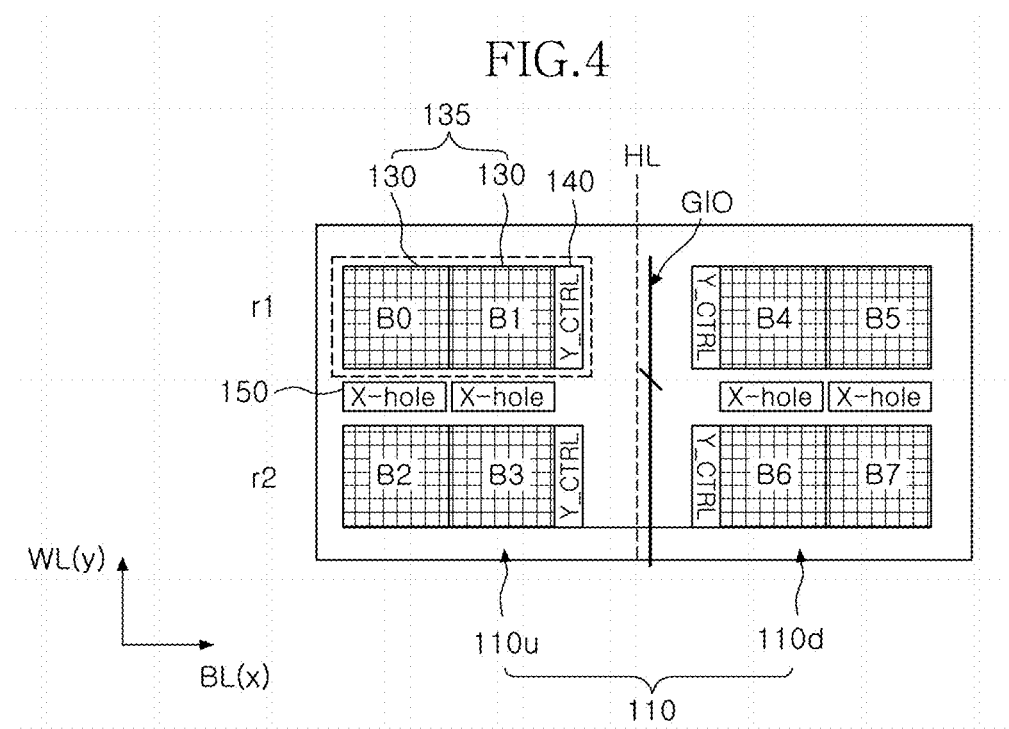
FIG. 4 is an enlarged plan view illustrating one stack bank of the semiconductor memory apparatus shown in FIG. 3 according to one embodiment.

As shown in FIGS. 3 and 4, the semiconductor memory apparatus 100 can be designed such that two sub-banks 130 share one Y-control block (Y_CTRL) 140. In detail, the semiconductor memory apparatus 100 can be designed such that the sub-banks 130 are continuously arranged in the same rows (r1 and r2 or the same columns) within one half bank 110u or 110d, and the continuously arranged sub-banks 130 share one Y-control block 140 without uncoupling of signal lines.

When the sub-banks 130 are continuously arranged as described above, it will be referred to as "the sub-banks are stacked", in which the "stack" means the status in which sub-banks different from each other have been continuously arranged without uncoupling or disconnection of the signal lines (e.g. bit lines). Further, the row or column can be parallel to the bit line, and the same row or column represents that the row or column exists on the extension line of the same bit line. In addition, the stacked sub-banks 130 will be referred to as a stack bank structure 135.

According to the present embodiment, a stack bank structure 135 can include two sub-banks 130. However, it will be understood that more than two sub-banks 130 can be included in a stack bank structure 135.

The Y-control block 140 can be located at an edge of one side of the stack bank structure 135. For example, since the Y-control block 140 includes circuits for controlling a 'Yi' signal used for driving the bit line BL, the Y-control block 140 can be located at the edge of the stack bank structure 135 that is perpendicular to the bit line BL. The Y-control block 140 can include an address control block (not shown) and an Input/output control block (not shown). Here, the address control block can be a decoding block and the address control block can be a controller of input/output sense amplifier, a read driver and a write driver.

A plurality of global input/output lines can be arranged between the Y-control blocks 140. For example, the global input/output (GIO) lines can be located adjacently to the half line that separate the up bank 110u from the down bank 110d.

A predetermined number of global input/output (GIO) lines can be allocated to each stack bank structure 135, and the allocated global input/output (GIO) lines can be used for transferring data to and from the sub-banks 130 constituting the stack bank structure 135. Thus, as compared with a conventional circuit in which the global input/output lines are allowed to each sub-bank 130, in the embodiment of FIGS. 3 and 4, the global input/output (GIO) lines can be allowed to each stack bank structure 135, so that the total number of the global input/output (GIO) lines can be reduced.

In a conventional circuit, two global input/output lines have been necessary for each sub-bank 130. In general, eight global input/output lines at minimum have been necessary for the sub-banks 130. However, in the embodiment of FIGS. 4 and 5, only two global input/output (GIO) lines are necessary for each stack bank structure 135. Thus, the number of the global input/output lines can be reduced per each bank, so that the alignment margin for the global input/output lines can be improved. Further, since there is no need to arrange the global input/output line between the sub-banks 130, the size of the sub-banks 130 can be increased without increasing the overall area of the circuit 100.

In the embodiment of FIGS. 3 and 4, two sub-banks 130 are stacked to share one Y-control block 140. Further, the global input/output (GIO) line arranged between the sub-banks 130 is shifted and arranged between the stack bank structures 135. Thus a gap between the sub-banks 130 can be decrease.

When two sub-banks 130 are stacked in such a manner, an area corresponding to one Y-control block 140 can be reduced, so that the area of the sub-bank 130 can be increased by the area of one Y-control block 140. Further, the area needed for a Y-control block 140 can be provided between the stack bank structures 135 that ensures enough space for forming the global input/output (GIO) line.

Further, since the number of global input/output (GIO) lines is reduced, the alignment margin for the global input/output (GIO) lines can be improved. Consequently, since the alignment margin (or arrangement area) for the global input/output (GIO) lines can be ensured, the line width of the global input/output (GIO) lines not an issue, which can prevent signal delay. Further, the spacing related to the global input/output (GIO) lines can also be sufficiently ensured, thereby preventing crosstalk from occurring.

Figure 5:
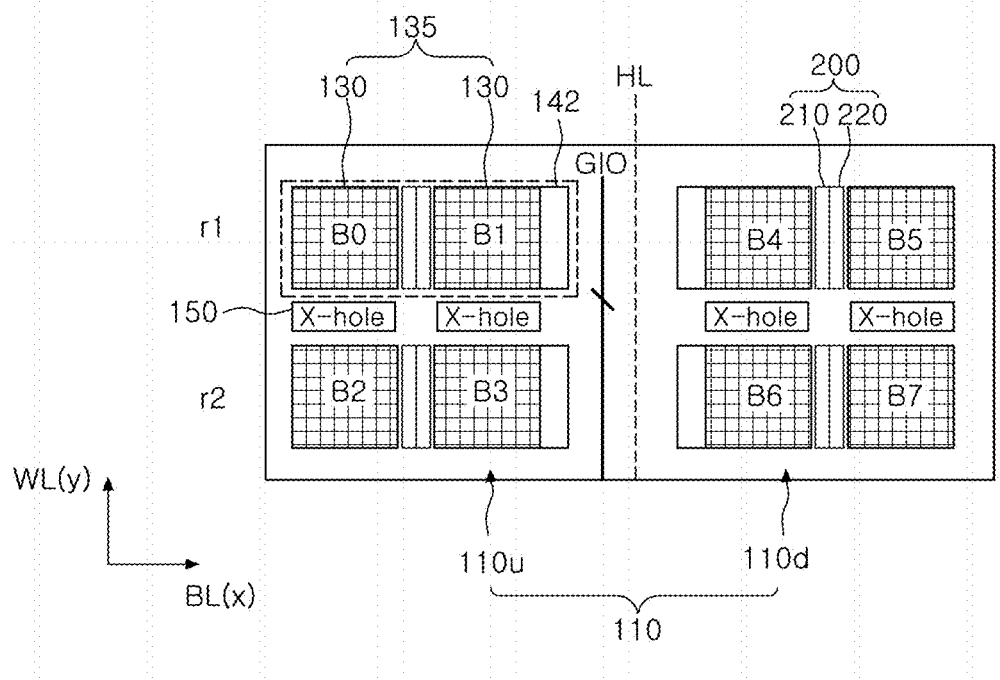
FIG. 5 is an enlarged plan view illustrating one stack bank of the semiconductor memory apparatus shown in FIG. 3 according to another embodiment.

Meanwhile, referring to FIG. 5, in the stack bank structure 135, a part of the Y-control block 140 can be interposed between the sub-banks 130. For example, the address control block of the Y-control block 140 can be interposed between the sub-banks 130 and the input/output control block 142 of the Y-control block can be located at the edge of one side of the stack bank structure 135. The address control block can be a decoding block 200. The input/output control block can include a controller of an input/output sense amplifier (not shown), a read driver (not shown) and a write driver (not shown). The decoding block 200 can include a main decoder 210 and a predecorder 220 and can decode 'Yi' signals of the sub-banks 130.

In general, the stacked sub-banks 130 can share one decoding block 200, similarly to manner in which one Y-control block 140 is shared. Thus, sufficient area for each decoding block 200 can be ensured. Further, since each decoding block 200 is arranged between the sub-banks 130, the efficiency of the address signal can be improved.

Figure 6:
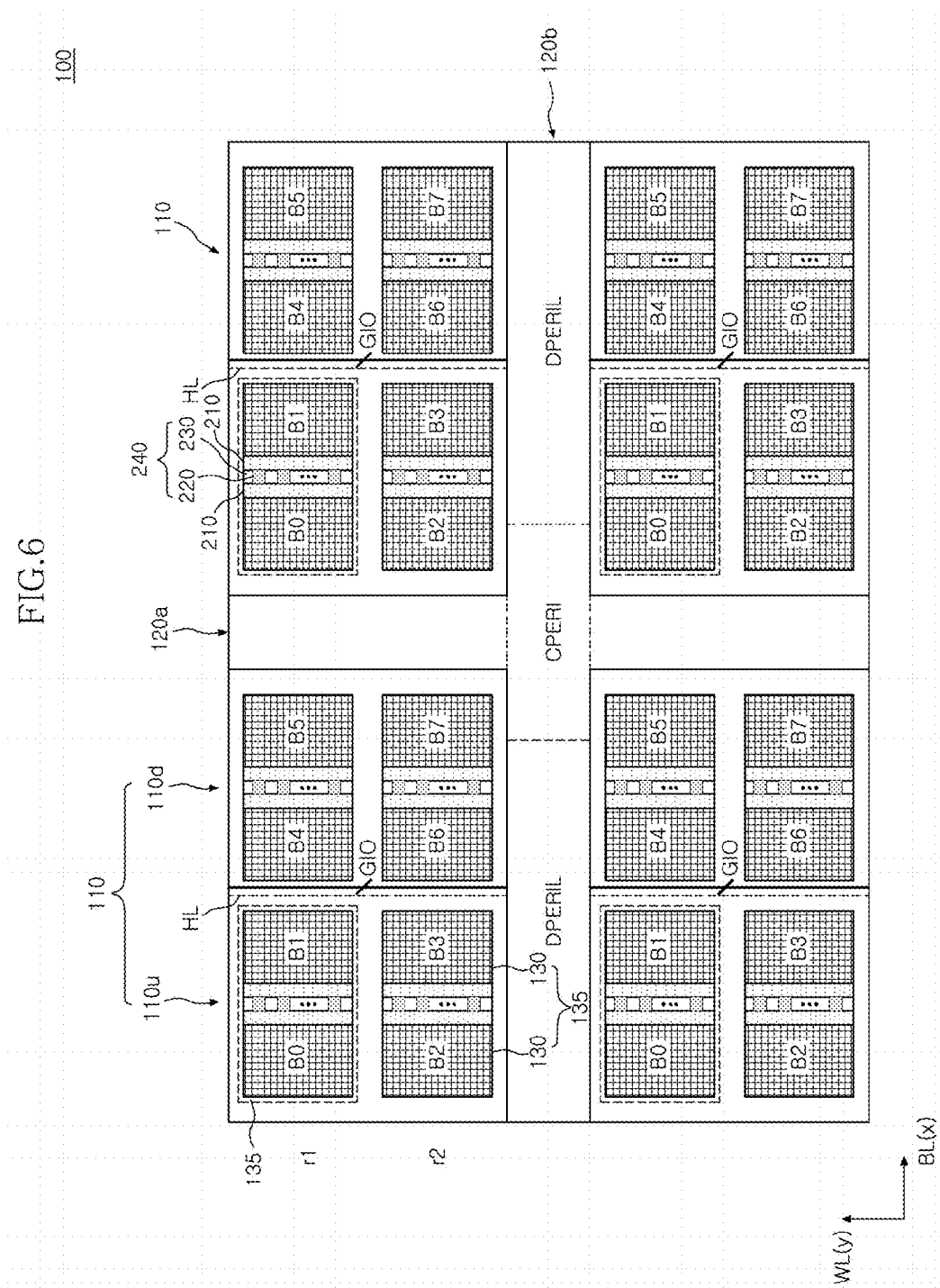
FIG. 6 is a plan view illustrating a stack bank type semiconductor memory apparatus according to another embodiment.
Figure 7:
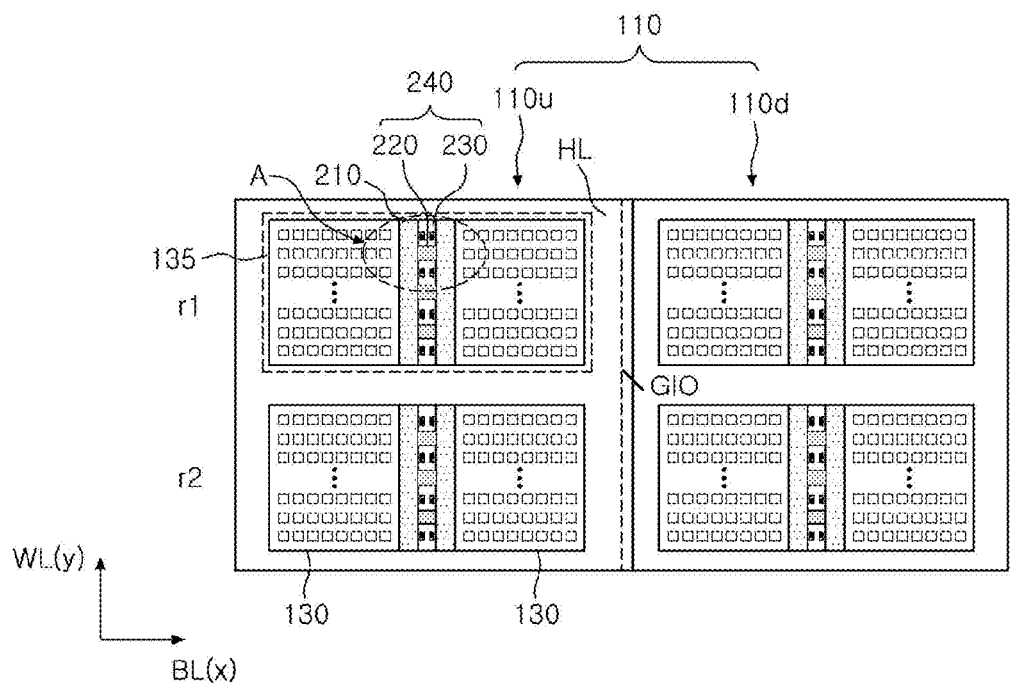
FIG. 7 is an enlarged plan view illustrating one stack bank of the semiconductor memory apparatus shown in FIG. 6.

Further, as shown in FIGS. 6 and 7, the sub-banks 130 constituting the stack bank structure 135 can share the predecoder 220 and a fuse set 230. Hereinafter, the predecoder 220 and the fuse set 230 will be referred to as a share block 240. In detail, the main decoders 210 can be provided between opposite edges of the sub-banks 130 constituting the stack bank structure 135, and the share block 240 can be provided between the main decoders 210.

As is generally known, the predecoder 220 can predecode the 'Yi' signal for selecting the bit line BL, and the fuse set 230 can include a repair Yi signal transmission line for repairing a defect of a Yi signal transmission line, which occurs in the memory cells constituting the sub-banks 130.

Figure 8:
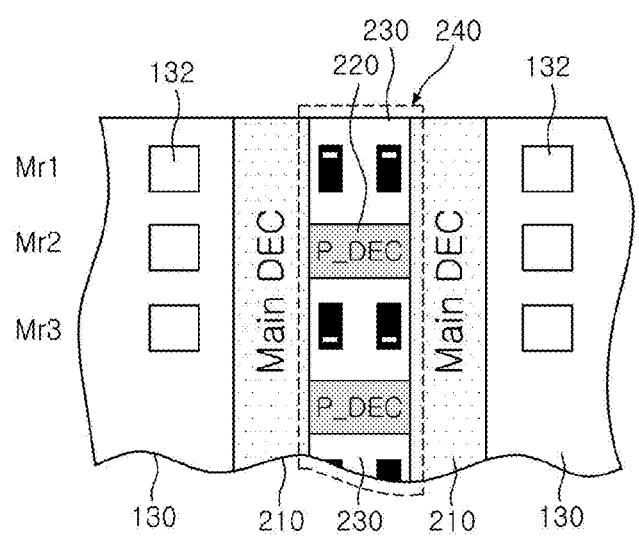
FIG. 8 is an enlarged plan view illustrating an "A" part that can be included in the one stack bank shown in FIG. 7.

As shown in FIG. 8, the predecoder 220 and the fuse set 230 can be alternately arranged in the share block 240, e.g., in the vertical direction (e.g. word line extension direction). The predecoder 220 and the fuse set 230 can be alternately arranged corresponding to mat rows Mr1 to Mr3, respectively. Such an arrangement can facilitate transmission of the 'Yi' signal between the fuse set 230 and the predecoder 220 and reduce the length of a line for transmitting information on a defective 'Yi' signal.

Conventional fuse sets are configured such that they correspond to entire mat rows. In the embodiments described herein, however, since the fuse sets 230 are selectively arranged corresponding to odd mat rows or even mat rows, the number of the fuse sets can be reduced by a half as compared with the number of conventional fuse sets 230. In general, since a defect of the 'Yi' signal does not occur relative to entire mats 132 in the sub-bank 130, problems may not occur in a repair operation even if the number of the fuse sets 230 is reduced by ½.

Figure 9:
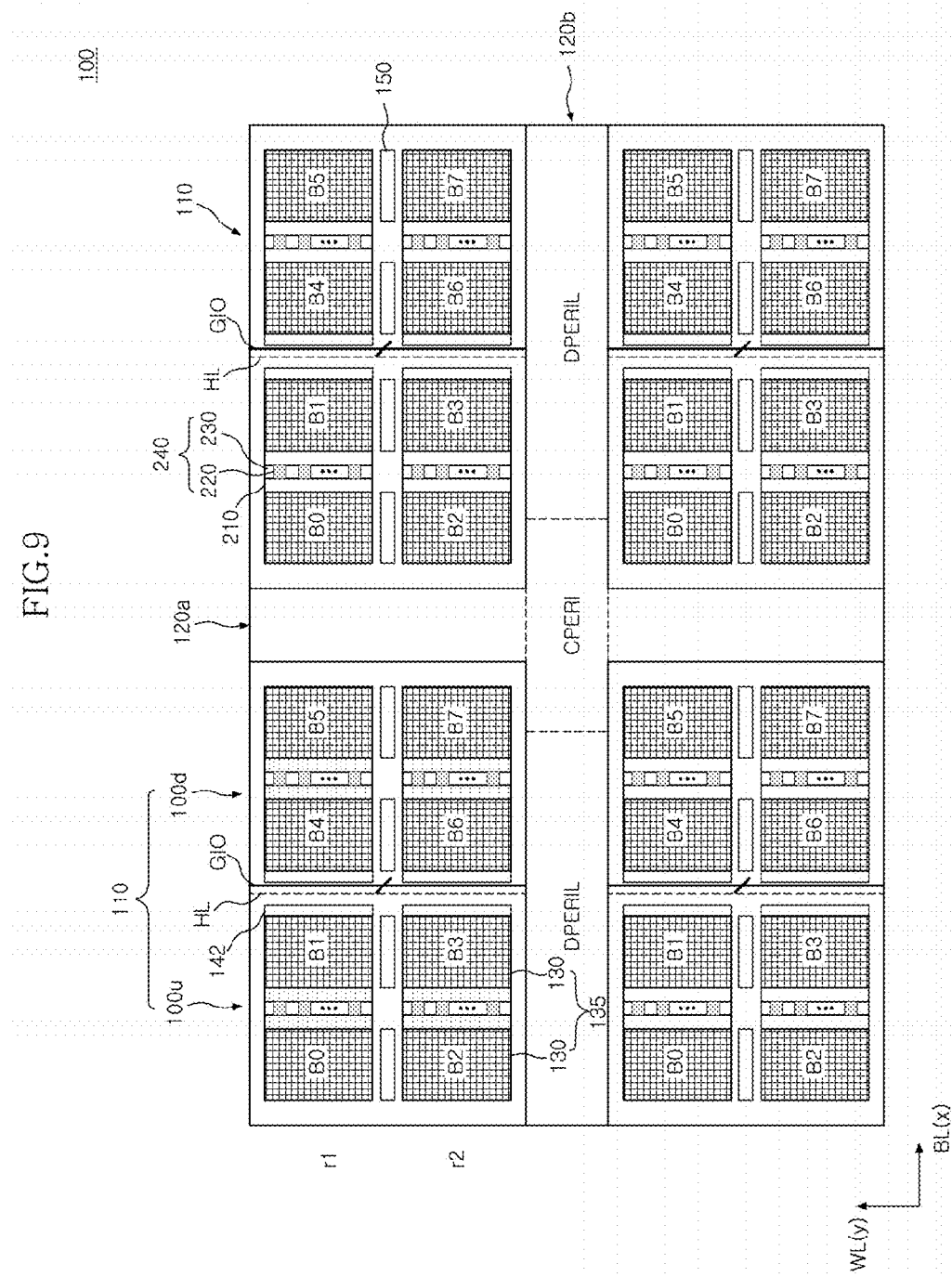
FIG. 9 is a plan view illustrating a stack bank type semiconductor memory apparatus according to still another embodiment.

Further, as shown in FIG. 9, the sub-banks 130 constituting the stack bank structure 135 can simultaneously share the share block 240, which can include the predecoder 220 and the fuse set 230, and the Input/Output controller 142 of the Y-control block. The Input/Output controller 142 of Y-control block can be arranged at the edge of the stack bank structure 135 perpendicular to the bit lines BL.

According to the embodiments described herein, the sub-banks 135 located on the extension line of the same bit lines can be stacked in the half banks 110u and 110d while sharing the predecoder 220 and the fuse set 230. Thus, the area needed for the corresponding to the predecoder 220 and the fuse set 230 can be ensured in the banks as well as the half banks, even in the face of increased integration.

Further, since the predecoder 220 and the fuse set 230 can be alternately arranged corresponding to the mat rows constituting the sub-bank in the share block space, mutual control signals (repair 'Yi' signals) can be easily transmitted and thus the length of the signal line can be reduced.

Furthermore, the sub-banks can be stacked so that the global input/output (GIO) lines can be collected between the stack bank structures. Thus, there is no need for ensuring a space between the sub-banks to accommodate the global input/output (GIO) lines. In addition, the global input/output (GIO) lines arranged corresponding to the sub-banks can be arranged corresponding to the stack bank structures, so that the number of the global input/output (GIO) lines can be reduced.

Figure 10:
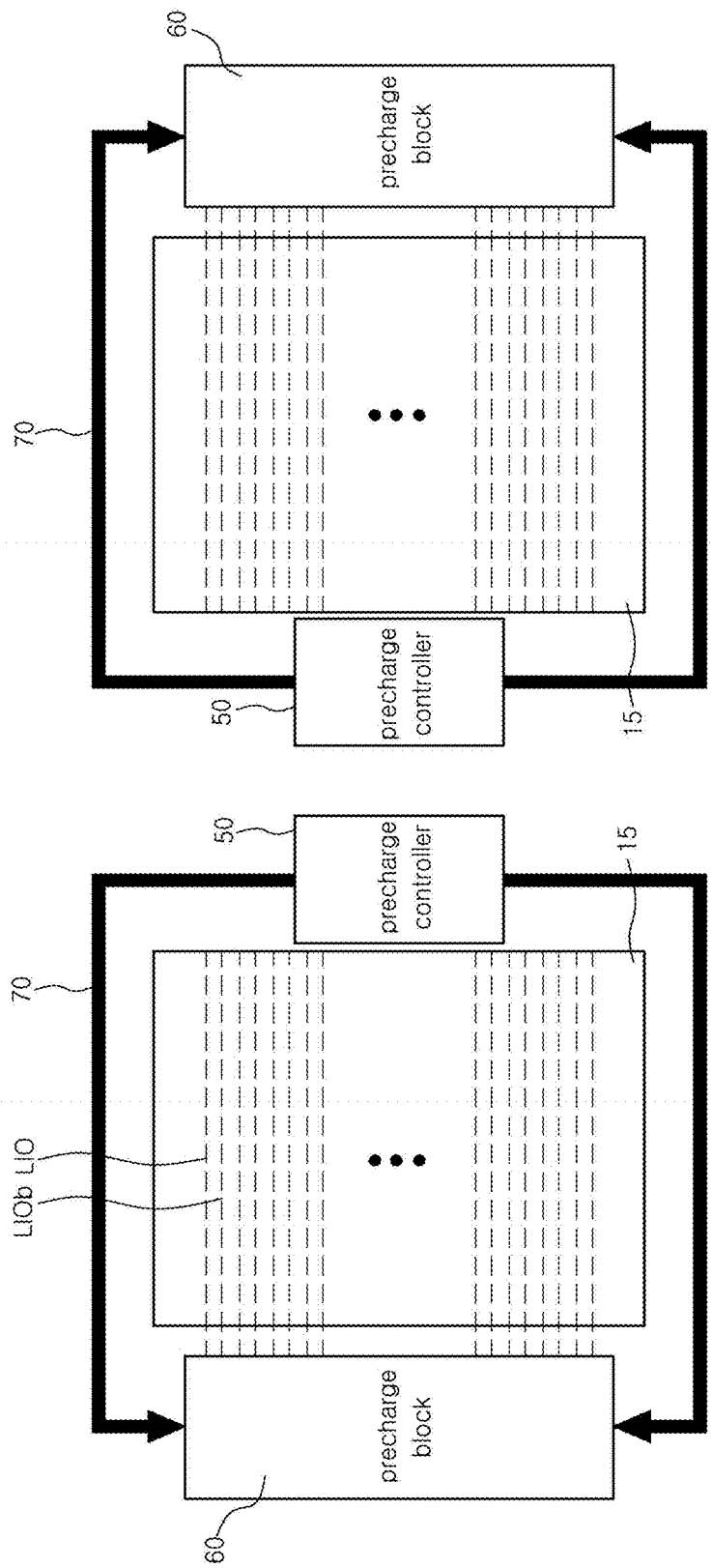
FIG. 10 is a plan view illustrating a general bank having a precharge block.

Moreover, as shown in FIG. 10, a conventional semiconductor memory apparatus is designed such that one precharge controller 50 and one precharge block 60 are provided per sub-bank 15. In addition, the precharge controller 50 and the precharge block 60 are positioned on either side of the sub-bank 15, and are electrically interconnected through a precharge interconnection 70. Thus, since the length of the precharge interconnection 70 is greater than that of the sub-bank 15, serious signal skew and delay occur. In FIG. 10, reference LIO denotes a local input/output signal line and reference LIOb denotes an inverted local input/output signal line.

FIG. 11 is a timing diagram illustrating a reset interval of an input/output line when the precharge controller and the precharge block are positioned as illustrated in FIG. 10. Referring to FIGS. 10 and 11, when the precharge controller 50 and the precharge block 60 are spaced apart from each other by the length of the sub-bank 15, since a signal transmission path is increased, a skew may occur in a precharge control signal. Therefore, a reset interval (a') of the local input/output line LIO is narrower than a desired interval (a).

In the embodiments described herein, as shown in FIG. 12, a precharge block 300 can be provided between the stacked sub-banks 130. Thus, the sub-banks 130 constituting the stack bank structure 135 share one precharge block 300. The "stack arrangement" of the sub-banks means that the sub-banks 130 are continuously arranged without electrical uncoupling or disconnection of data lines, e.g. the local input/output lines LIO and LIOb. Further, if there is no disconnection of data lines between sub-banks, the sub-banks can be referred to as being in a "stack arrangement" as described herein even if the sub-banks are spaced apart from each other at a predetermined interval. That is, if the data lines are connected with each other through a connection medium, the sub-banks can be referred to as being in a "stack arrangement".

The precharge block 300 can include a plurality of precharge units 310 connected with the local input/output lines LIO and LIOb of the sub-bank 130, respectively. A precharge controller 320 can be provided in at least one of both sides of the precharge block 300 to receive a precharge command from a peripheral circuit area (not shown) and then provide the precharge block 300 with control signals 'LIOpcg_UP' and 'LIOpcg_DN'. Since the precharge controller 320 is provided in at least one of both sides of the precharge block 300, a path for receiving the control signals can be significantly shortened. For example, the precharge controller 320 can be located at the peripheral area. Consequently, the signal delay and signal skew can be reduced or eliminated.

Figure 13:
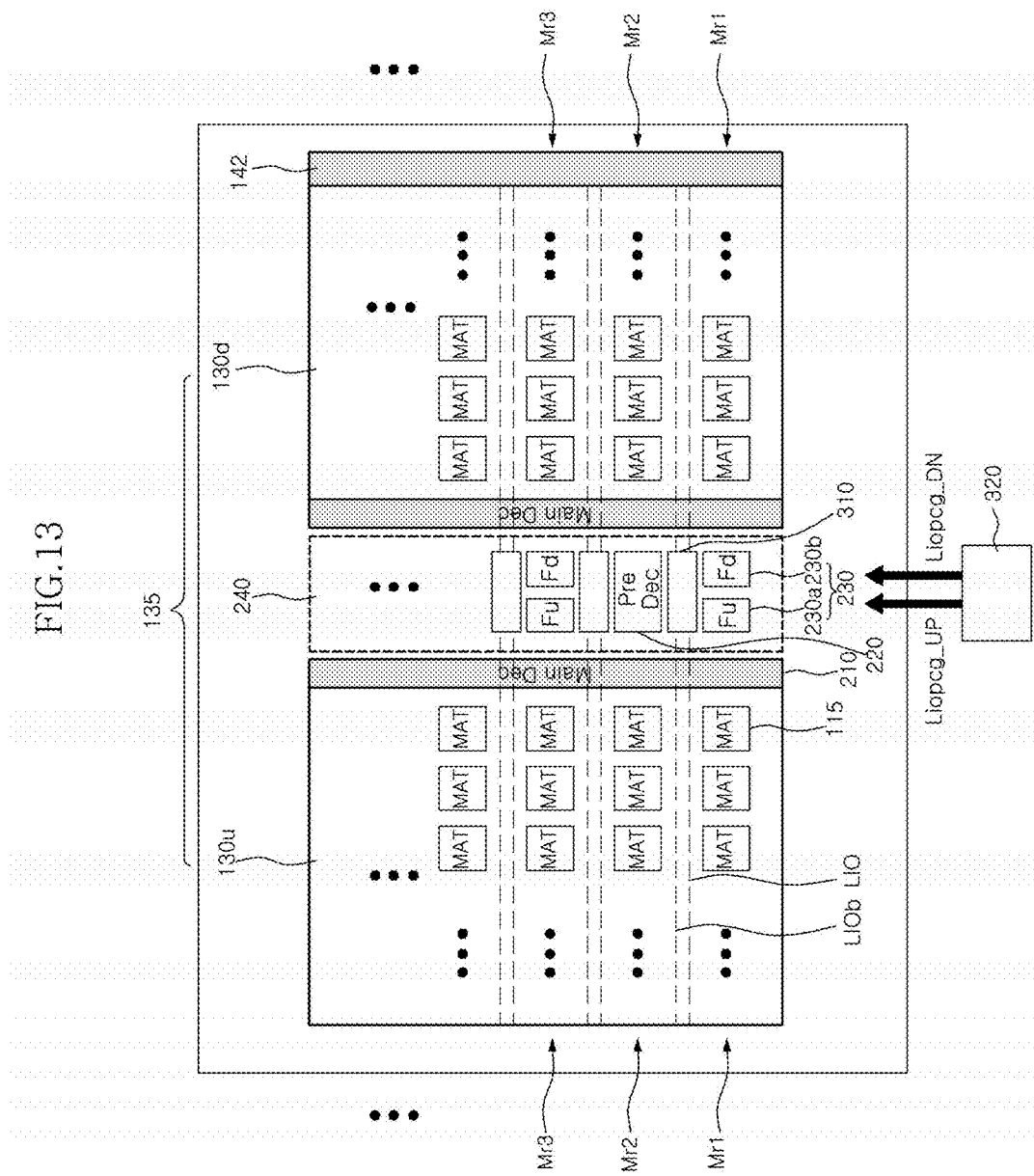
FIG. 13 is an enlarged plan view illustrating one stack bank of the semiconductor memory apparatus shown in FIG. 12.

In more detail, as shown in FIG. 13, each sub-bank 130 can have mats 115 arranged in the form of a matrix including a plurality of mat rows Mr1 to Mr3 and a plurality of mat columns. As will be understood, the mats 115 can include a set of a plurality of word lines (not shown), a plurality of bit lines (not shown), and a plurality of memory cells. The mats 115 can be spaced apart from each other at a predetermined interval, and a pair of the local input/output lines LIO and LIOb can be arranged in the space between the mats 115, respectively, i.e., in the space corresponding to the direction parallel to bit lines (not shown) constituting the mats 115.

Meanwhile, the main decoders 210 can be arranged at opposite sides of the sub-banks 130 to generate the column control signals ('Yi' signals).

Further, the predecoder 220, the fuse set 230 and the precharge unit 310 can be arranged in the space between the opposite main decoders 210. The predecoder 220 and the fuse set 230 can be alternately arranged corresponding to the mat rows Mr1 to Mr3, and the precharge unit 310 can be arranged between the predecoder 220 and the fuse set 230 corresponding to the local input/output lines LIO and LIOb.

The fuse set 230 can be used for repairing a defect, which occurs in a column line of a corresponding mat column, and can include a first fuse (Fu) 230a, which controls a defect of a corresponding mat row of a first sub-bank 130u, and a second fuse (Fd) 230b that controls a defect of a corresponding mat row of a second sub-bank 130d. A fuse controller (not shown) can be interposed between the first and second fuses 230a and 230b.

As described above, the precharge units 310 can be arranged between the fuses 230a and 230b and the predecoder 220, respectively. In detail, the precharge units 310 can be arranged in the spaces among mat rows Mr1 to Mr3 in which the local input/output lines LIO and LIOb are arranged. Thus, the precharge units 310 can be connected with the local input/output lines LIO and LIOb so that the first and second sub-banks 130u and 130d can be stacked without substantial disconnection of the local input/output lines LIO and LIOb.

When the control signals 'LIOpcg_UP' and 'LIOpcg_DN' are enabled, the precharge unit 310 can precharge the local input/output lines LIO and LIOb by using predetermined voltage, e.g., bit line precharge voltage VBLP.

Figure 14:
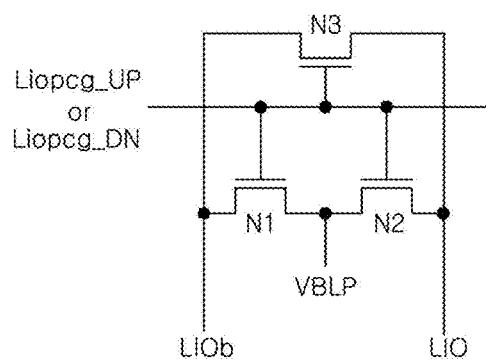
FIG. 14 is a circuit diagram illustrating a precharge unit according to an embodiment.

For example, as shown in FIG. 14, the precharge unit 310 can include first to third MOS transistors N1 to N3. The first MOS transistor N1 can have a gate for receiving the precharge control signal 'LIOpcg_UP' or 'LIOpcg_DN', a source connected with the local input/output line LIOb, and a drain for receiving the bit line precharge voltage VBLP. The second MOS transistor N2 can have a gate for receiving the precharge control signal 'LIOpcg_UP' or 'LIOpcg_DN', a source connected with the local input/output line LIO, and a drain for receiving the bit line precharge voltage VBLP. The third MOS transistor N3 can have a gate for receiving the precharge control signal 'LIOpcg_UP' or 'LIOpcg_DN', a source connected with the local input/output line LIOb, and a drain connected with the local input/output line LIO.

As described above, the Input/Output controller 140 of the Y-control block can be located at one edge of the stack bank structure 135.

The precharge block 300 including the precharge units 310 having the afore-described construction can be arranged in the share block 240 between the stacked sub-banks, so that an area corresponding to one precharge block 300 can be saved. Further, the precharge controller 320 can be provided in at least one side of the precharge block 300, so that the transmission path for the precharge control signal can be reduced.

Figure 15:
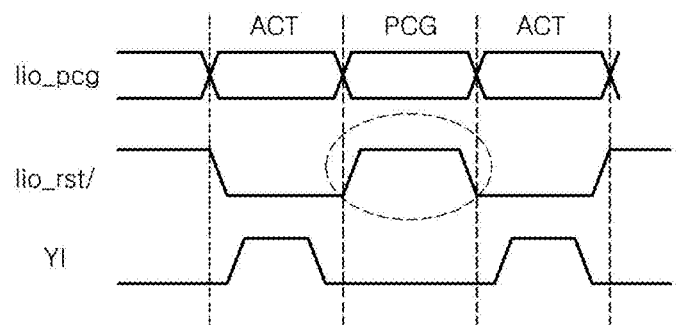
FIG. 15 is a timing diagram illustrating a reset interval of a local input/output line in a semiconductor memory apparatus according to an embodiment.

FIG. 15 is a timing chart illustrating a reset interval of the local input/output line for the embodiments described herein.

Referring to FIG. 15, since the signal skew is significantly reduced as the transmission path for the precharge control signal is reduced, the reset interval LIO_rst/ of the local input/output lines LIO and LIOb occupies the entire space limited to a precharge interval PCG. Thus, the reset interval of the local input/output lines LIO and LIOb can be sufficiently ensured.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A semiconductor memory apparatus comprising:
a pair of sub-banks having a plurality of mat rows and a plurality of mat columns formed by a plurality of mats;
a pair of data bus lines arranged in a space between the mat rows of each of the pair of sub-banks;
a plurality of precharge units arranged between the pair of sub-banks corresponding to a space between the plurality of mat columns to be electrically connected with the data bus lines; and
main decoders arranged at opposite sides of each of the pair of sub-banks and configured to generate column control signals of the mats,
wherein the plurality of precharge units are arranged between the main decoders.

2. The semiconductor memory apparatus of claim 1, further comprising a fuse structure arranged at one side of each of the plurality of precharge units and configured to repair a defect of the plurality of mat columns, and a predecoder arranged at an opposite side of each of the plurality of precharge units to generate the column control signals of the mats.

3. The semiconductor memory apparatus of claim 2, wherein the fuse structure and the predecoder are arranged between the pair of sub-banks corresponding to a space between the plurality of mat columns.

* * * * *